(12) United States Patent
Lee et al.

(10) Patent No.: US 7,592,661 B1
(45) Date of Patent: Sep. 22, 2009

(54) CMOS EMBEDDED HIGH VOLTAGE TRANSISTOR

(75) Inventors: Sungkwon Lee, Eden Prairie, MN (US); Helmut Puchner, Santa Clara, MN (US)

(73) Assignee: Cypress Semiconductor Corporation, San Jose, CA (US)

(*) Notice: Subject to any disclaimer, the term of this patent is extended or adjusted under 35 U.S.C. 154(b) by 0 days.

(21) Appl. No.: 11/489,047

(22) Filed: Jul. 19, 2006

Related U.S. Application Data

(60) Provisional application No. 60/704,187, filed on Jul. 29, 2005.

(51) Int. Cl.
*H01L 27/108* (2006.01)
*H01L 29/94* (2006.01)

(52) U.S. Cl. ............... 257/311; 257/296; 257/300; 257/390; 257/E27.048

(58) Field of Classification Search ......... 257/295–310, 257/355, 379–535, 404, 656, 311, E27.048
See application file for complete search history.

(56) References Cited

U.S. PATENT DOCUMENTS

| | | | |
|---|---|---|---|
| 6,190,954 B1 * | 2/2001 | Lee et al. ............... | 438/199 |
| 6,498,518 B1 * | 12/2002 | Houghton et al. ........ | 327/72 |
| 6,548,874 B1 * | 4/2003 | Morton et al. ........... | 257/371 |
| 6,660,603 B2 | 12/2003 | Mitros | |
| 6,750,489 B1 * | 6/2004 | Merrill .................... | 257/292 |
| 6,836,148 B2 | 12/2004 | Pullen et al. | |
| 6,900,101 B2 | 5/2005 | Lin | |
| 6,911,696 B2 | 6/2005 | Denison | |
| 7,157,784 B2 * | 1/2007 | Mitros et al. ............ | 257/532 |
| 7,202,114 B2 * | 4/2007 | Salcedo et al. .......... | 438/133 |
| 7,408,218 B2 * | 8/2008 | Akiyama et al. ........ | 257/311 |
| 2002/0171103 A1 * | 11/2002 | Spadea .................... | 257/328 |
| 2003/0071301 A1 * | 4/2003 | Wald et al. .............. | 257/314 |
| 2003/0123314 A1 * | 7/2003 | Buer et al. .............. | 365/225.7 |
| 2004/0014264 A1 * | 1/2004 | Oh ........................... | 438/197 |
| 2004/0232497 A1 * | 11/2004 | Akiyama et al. ........ | 257/390 |

* cited by examiner

*Primary Examiner*—Zandra Smith
*Assistant Examiner*—Telly D Green

(57) ABSTRACT

A circuit having a high voltage, drain-extended (DE) metal-oxide-semiconductor (MOS) transistor and method for fabricating the same are provided. Generally, the circuit includes an n-channel (NMOS) transistor having: (i) a source and drain formed in a substrate, the source separated from the drain by a channel; and (ii) a diffused deep n-well (DNW) formed by a long, high temperature drive-in step. The DNW forms a drain-extension region for the NMOS transistor surrounding the drain and extending a predetermined distance into the channel. The drain extension region has a doping concentration lower than the source and drain to deplete during reverse biasing of the transistor, thereby raising a breakdown voltage of the transistor. Preferably, the circuit further includes a DE p-channel MOS (PMOS) transistor in which the DNW forms a well tub for the PMOS transistor, and a p-well in DNW forms a DE region therefore. Other embodiments are also disclosed.

18 Claims, 4 Drawing Sheets

CMOS EMBEDDED HIGH VOLTAGE TRANSISTOR

CROSS-REFERENCE TO RELATED APPLICATIONS

The present application claims the benefit of priority under 35 U.S.C. 119(e) to U.S. Provisional Patent Application Ser. No. 60/704,187, filed Jul. 29, 2005, entitled CMOS Embedded High Voltage Transistor; which application is hereby incorporated by reference.

TECHNICAL FIELD

The present invention relates generally to semiconductor devices and more particularly to drain-extended high voltage transistors and fabrication methods for making the same.

BACKGROUND OF THE INVENTION

Drain-extended (DE) architectures have been used to provide transistors having higher breakdown voltages (BV) for use in high power and high voltage applications. Briefly, in a DE transistor the drain is extended by a low doped semiconductor region which depletes during reverse biasing, thereby allowing much of voltage to be dropped across a channel in the substrate, and thereby reducing the electric field across a gate oxide to a safe level.

An example of a conventional drain-extended n-channel MOS transistor 100 is depicted in FIG. 1.

Referring to FIG. 1, the transistor 100 generally includes a source 102 and drain 104 formed in a p-type semiconductor substrate 106 (p-substrate), and separated by a channel 108 underlying a gate electrode 110. Generally, the transistor 100 further includes an isolation structure 112, such as a field oxidation region (as shown) or a shallow trench isolation (STI), formed at least partially under the gate electrode 110 and isolating the drain 104 from the channel 108 to increase the BV between the source 102 and drain 104. A first well 114 (which is doped to be p-type for a p-channel transistor and n-type for an n-channel transistor) encompasses the drain 104 forms a drain extension region 116. A second well 118, shown here as p-body or p-well, is implanted within the first well 114 to encompass the source 102. Thus, the BV of the transistor 100 is defined by a junction or diode (D1) between the first and second wells, plus a distance or length (L1) of the isolation structure 112 separating the drain 104 from the drain extension region.

Examples of other conventional drain-extended transistor including a reduced surface effect (RESURF) architecture are shown in FIGS. 2 and 3. In particular, a DE NMOS transistor 200 having a RESURF architecture is depicted in FIG. 2, a DE PMOS is shown in FIG. 3. This architecture has been published to achieve higher BV. The basic idea is to extend the drain by a low doped semiconductor region which depletes during reverse biasing and inverts during forward biasing.

Referring to FIG. 2, a DE NMOS transistor 200 generally includes a n+ doped source 202 and n+ doped drain 204 formed in a p-substrate 206, and separated by a channel 208 underlying a gate electrode 210. Generally, the transistor 200 further includes an isolation structure 212, such as a field oxidation region or a STI (as shown) isolating the drain 204 from the channel 208 to increase the BV between the source 202 and drain 204. A first n-type well 214 encompasses the drain 204 forms a drain extension region 216. A second p-well or p-body 218 is implanted in the substrate 206 encompassing the source 202 and overlapping the first well 214. As noted above, the drain extension region 216 is lightly doped to deplete during reverse biasing providing a high resistance increasing the BV of the transistor 200. Thus, the BV of the transistor 200 is defined by the doping and the length of the drain extension region 216 separating the drain 204 from the channel region 208.

Referring to FIG. 3, a DE PMOS transistor 300 includes a p+ doped source 302 and drain 304 formed in a p-substrate 306, and separated by a channel 308 underlying a gate electrode 310. The transistor 300 further includes an isolation structure 312, such as a STI, isolating the drain 304 from the channel 308. An n-type first well 314 encompasses the source 302. A second p-well 316 is implanted in the first well 314 encompasses the drain 304 and the isolation structure 312, forming a drain extension region 318. The drain extension region 318 is lightly doped to deplete during reverse biasing providing a high resistance increasing the BV of the transistor 300.

Although the DE transistors described above do provide higher breakdown voltages than conventional transistors, they suffer from a number of problems or shortcomings.

One problem is conventional methods of fabricating DE transistors require separate device wells and doping levels, which are typically not compatible with complimentary metal-oxide-semiconductor (CMOS) processes commonly used in manufacturing integrated circuits (ICs). Moreover, even when the methods of fabricating DE transistors are compatible with the manufacturing processes, the additional masking and implant steps required render them not cost effective.

Accordingly, there is a need for drain-extended high voltage transistor having architecture compatible with conventional methods of fabricating CMOS circuits. It is further desirable that the fabrication methods for making the DE transistor are capable of being fully integrated with or embedded into an existing CMOS flow with only minimal additional masking and process steps, and therefore are cost effective.

The present invention provides a solution to these and other problems, and offers further advantages over conventional methods of fabricating high voltage, DE transistors.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to high voltage drain-extended transistors and methods for fabricating the same.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The terms "coupling" and "to couple" as used herein may include both to electrically connect directly and indirectly connect through one or more intervening layers or components.

Drain-extended high voltage transistors are useful in applications in which it is desirable to provide higher drain breakdown voltages (BV) across the transistor, and/or in applications in which it is desirable to reduce the amount of voltage dropped across the drain extension region and a gate to drain extension edge. Preferably, the transistors and method of present invention enable high drain voltage operation without modifying existing processes and device architectures, such as gate oxide thicknesses. More preferably, the transistors are fabricated as part of a complimentary-metal-oxide-semiconductor (CMOS) circuit including high voltage, drain-extended (DE) n-channel (NMOS) transistors and high voltage DE p-channel (PMOS) transistors fabricated simultaneously on the same semiconductor substrate or wafer using existing CMOS processes.

Figure 1:
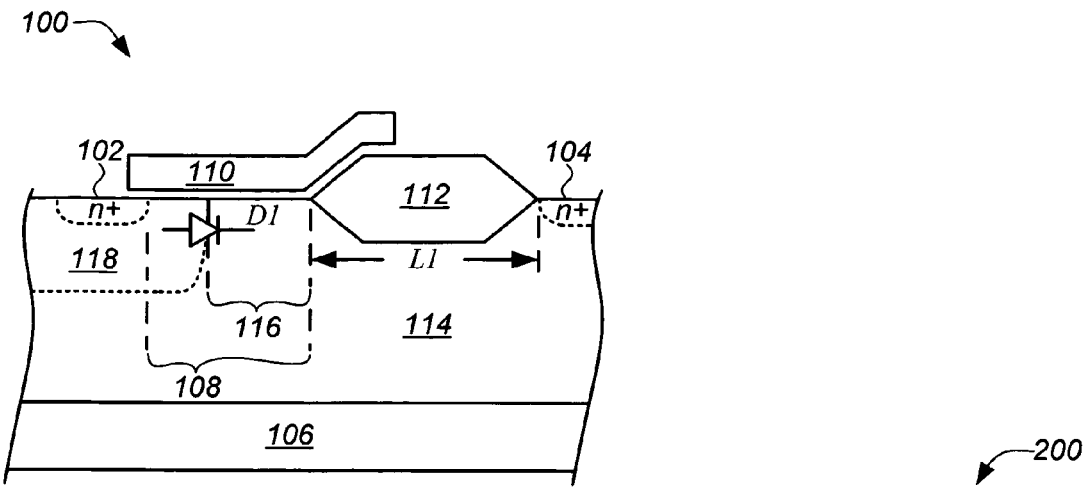
FIG. 1 (Prior Art) is a sectional block diagram of a conventional drain-extended metal-oxide-semiconductor (MOS) transistor.
Figure 2:
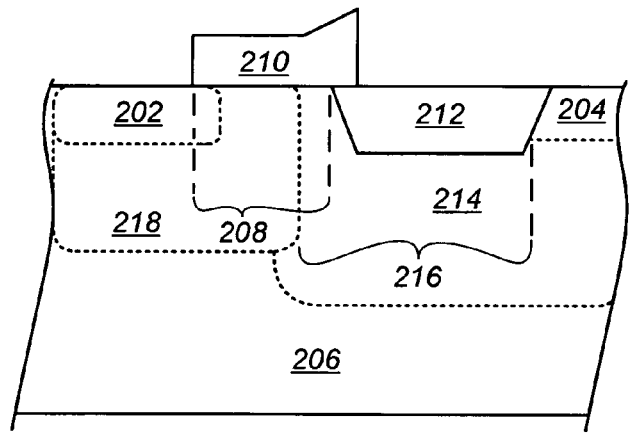
FIG. 2 (Prior Art) is a sectional block diagram of a conventional reduced surface effect (RESURF), drain-extended n-channel MOS (NMOS) transistor.
Figure 3:
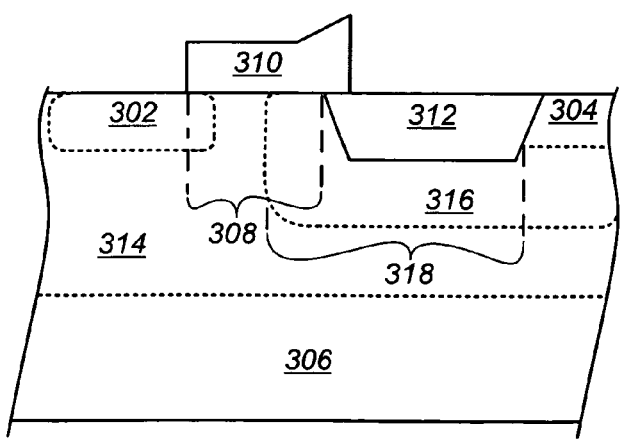
FIG. 3 (Prior Art) is a sectional block diagram of a conventional reduced surface effect (RESURF), drain-extended p-channel MOS (PMOS) transistor.
Figure 4:
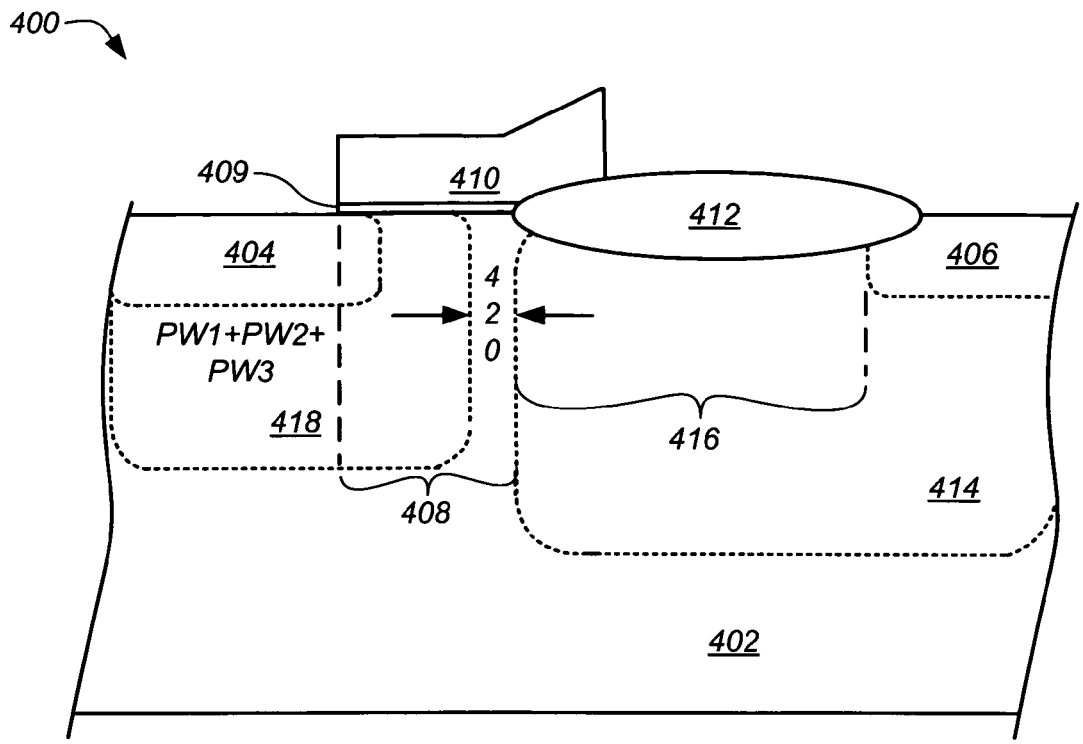
FIG. 4 is a sectional block diagram of a drain-extended high voltage NMOS transistor according to an embodiment of the present invention.
Figure 5:
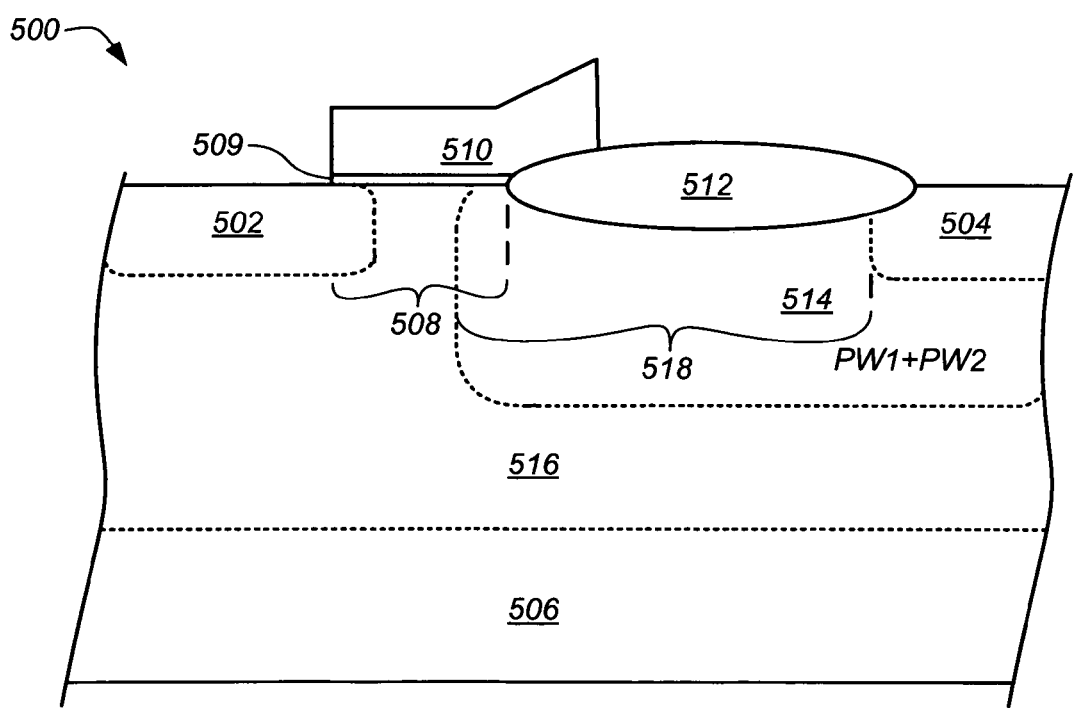
FIG. 5 is a sectional block diagram of a drain-extended high voltage PMOS transistor according to an embodiment of the present invention.

Drain-extended high voltage transistors according to various embodiments of the present invention will now be described in greater detail with reference to FIGS. 4 and 5. In particular, FIG. 4 is a sectional block diagram of a high voltage, drain-extended n-channel MOS metal-oxide-semiconductor (NMOS) transistor according to an embodiment of the present invention. FIG. 5 is a sectional block diagram of a drain-extended high voltage PMOS transistor.

Referring to FIG. 4, the transistor 400 is formed in a semiconductor wafer or substrate 402. The substrate 402 may include any known semiconductor material, such as Silicon, Gallium-arsenide, Germanium, Gallium-nitride, Aluminum-phosphide, and mixtures or alloys thereof. Preferably, the substrate 402 is a doped silicon-based semiconductor substrate, such as a p-type silicon substrate (p-substrate).

The transistor 400 includes a heavily doped n+ source 404 and a heavily doped n+drain 406 and separated by a channel 408 underlying a gate oxide 409 and a polycrystalline silicon or poly gate electrode 410. By heavily doped it is meant a concentration of suitable impurities or dopant ions, such as Arsenic ($As^+$) or Phosphorous ($P^+$), of from about 1e20 per cubic centimeter ($cm^{-3}$) to about $1e21\ cm^{-3}$, as compared to dopant concentration of about $8e14\ cm^{-3}$ in the p-type substrate 402. Generally, the transistor 400 further includes an isolation structure 412, such as a local oxidation of silicon (LOCOS) region or structure. Although shown here as a LOCOS structure, it will be appreciated that the isolation structure 412 can also include a field oxidation region or structure (FOX), or a shallow trench isolation (STI) structure. Preferably, the isolation structure 412 is formed at least partially under the gate electrode 410 and serves to isolate or separate the drain 406 from the channel 408. The amount of extension under the gate determines the breakdown as well as leakage behavior of such structure.

In accordance with the present invention, the transistor 400 has a multi-well architecture including a first lightly doped, diffused deep n-well (DNW) 414 surrounding or encompassing the drain 406 and forming the drain extension 416 in the DE NMOS transistor 400. By lightly doped it is meant a concentration of $As^+$ or $P^+$ impurities or dopant ions of from about $1e16\ cm^{-1}$ to about $5e18\ cm^{-3}$. The drain extension 416 in the lightly doped DNW 414 depletes during reverse biasing, thereby allowing much of voltage to be dropped across the channel 408 and reducing the electric field across a gate oxide to a safe level. A second p-well 418 surrounds or encompasses the source 404 and extends into the channel region 408.

Referring to FIG. 5, a DE PMOS transistor 500 generally includes a heavily doped p+ source 502 and a heavily doped p+ drain 504 formed in a semiconductor wafer or substrate 506 and separated by a channel 508 underlying a gate oxide 509 and a poly gate electrode 510. The heavily doped p+ source 502 and drain 504 may include impurities or dopant ions, such as Boron ($B^+$), at a concentration of from about $1e20\ cm^{-3}$ to about $1e21\ cm^{-3}$.

The transistor 500 further includes an isolation structure 512, such as a LOCOS structure, formed at least partially under the gate electrode 510, and which serves to isolate or separate the drain 504 from the channel 508.

As with the DE NMOS described above, the DE PMOS transistor 500 has a multi-well architecture including a first lightly doped, diffused deep n-well (DNW) 514 surrounding or encompassing the source 502 and extending into the channel region 508 and over the drain 504 fully enclosing the whole DE PMOS. A second p-well 516 surrounds or encompasses the drain 504 and forms a drain extension 518 of the DE PMOS transistor 500. The p-type PMOS drain extension 518 can be implanted or diffused to achieve depletion during reverse bias, thereby achieving a high junction breakdown or BV, and a high punch-through voltage between the drain extension and the p-substrate 506.

In accordance with another aspect of the present invention, the standard CMOS p-well (PW) doping is split into three (3) separate levels of doping illustrated in FIGS. 4 and 5 as PW1, PW2 and PW3. Preferably, the first p-well doping (PW1) is the lightest blanket implant implanted without a mask layer covering a surface of the substrate, and the p-well implant (PW2) is used to induce a lightly doped region in the DE PMOS drain extensions and the channel region. In an alternative embodiment the first p-well doping implant PW1 can be skipped to achieve a region between the DE NMOS and the channel region exhibiting only the substrate doping level. The second p-well doping implant (PW2) is targeted to create the drain extension region 518 of the DE PMOS transistor 500 as well as protecting the source 404 of the DE NMOS transistor 400 against punch through. However, the sum of the first and second implants, PW1+PW2, has to overcome the DNW 514 doping levels to form a lightly p-type drain extension region 518 in the DE PMOS transistor 500 as shown in FIG. 5. It will be noted that this lower level of doping, PW1+PW2, used for the drain extension 518 of the PMOS transistor 500 is significantly lower than that used to form the standard p-well employed in low voltage devices, and the PW1+PW2+PW3 level of doping used to form the p-well 418 in which the source 404 and channel of the DE NMOS 400 is fabricated.

In both the high voltage DE NMOS and DE PMOS transistors 400, 500, the drain extensions 416, 518, are more lightly doped than the highly doped drains 406, 504, so that during reverse bias depletion regions formed in the channels can extend far enough to reduce the electric field per unit length and achieve a high breakdown voltage or BV towards the substrate region. Thus, the lightly doped drain extensions 416, 518, regions deplete during reverse biasing and invert during forward biasing to drop most of the voltage applied to the drains 406, 504, of the high voltage DE NMOS and DE PMOS transistors 400, 500, of the present invention. For example, it has been found that with an applied drain voltage of about 45 to 46 volts, approximately 40 volts can be dropped across the drain extensions 416, 518, thereby limiting voltage across a gate oxide to about 5.5V, and enabling use of a standard low voltage gate oxide as isolation layer between the channels 408, 508 and the gate electrodes 410, 510.

In another embodiment, the drain extensions 416, 518, overlap the poly gate electrodes 410, 510, and are implanted in such a way that the overlap between the drain extensions and the poly gates is reduced to trade off an increase in breakdown voltage against a decrease in leakage current for shorter channel length devices.

In yet another aspect or embodiment of the present invention, the drain extension 416 of the DE NMOS transistor 400 is spaced apart from the remainder of the channel 408 or channel dopings to form a substantially doping free interface region or undoped gap 420 therebetween to form a p-doped, insulator, n-doped (P-I-N) region, which further increases the breakdown voltage of the transistor. That is part of the channel 408 is undoped, whereas the other part of the channel towards the source 404 is doped by the complete standard CMOS well doping. Preferably, the drain extension 416 and the remaining doped portion channel 408 are separated by a distance of from about 0.5 um to about 4 um, and more preferably at least about 0.5 um. In still another aspect or embodiment of the present invention, the gate oxide 409, 509, overlying the channel regions 408, 508, in both the DE NMOS and DE PMOS transistors 400, 500, can include a number of layers of non-volatile dielectric material to further raise the breakdown voltage of the transistor. Suitable non-volatile dielectric materials can include, for example Oxide/Nitride/Oxide or combination of LV & HV gate oxides.

Finally, in certain preferred embodiments both the DE NMOS and DE PMOS transistors 400, 500, have a lateral power CMOS transistor architecture. By lateral power CMOS architecture it is meant that the drain extended region, channel and source regions are formed laterally by using standard CMOS process.

Figure 6:
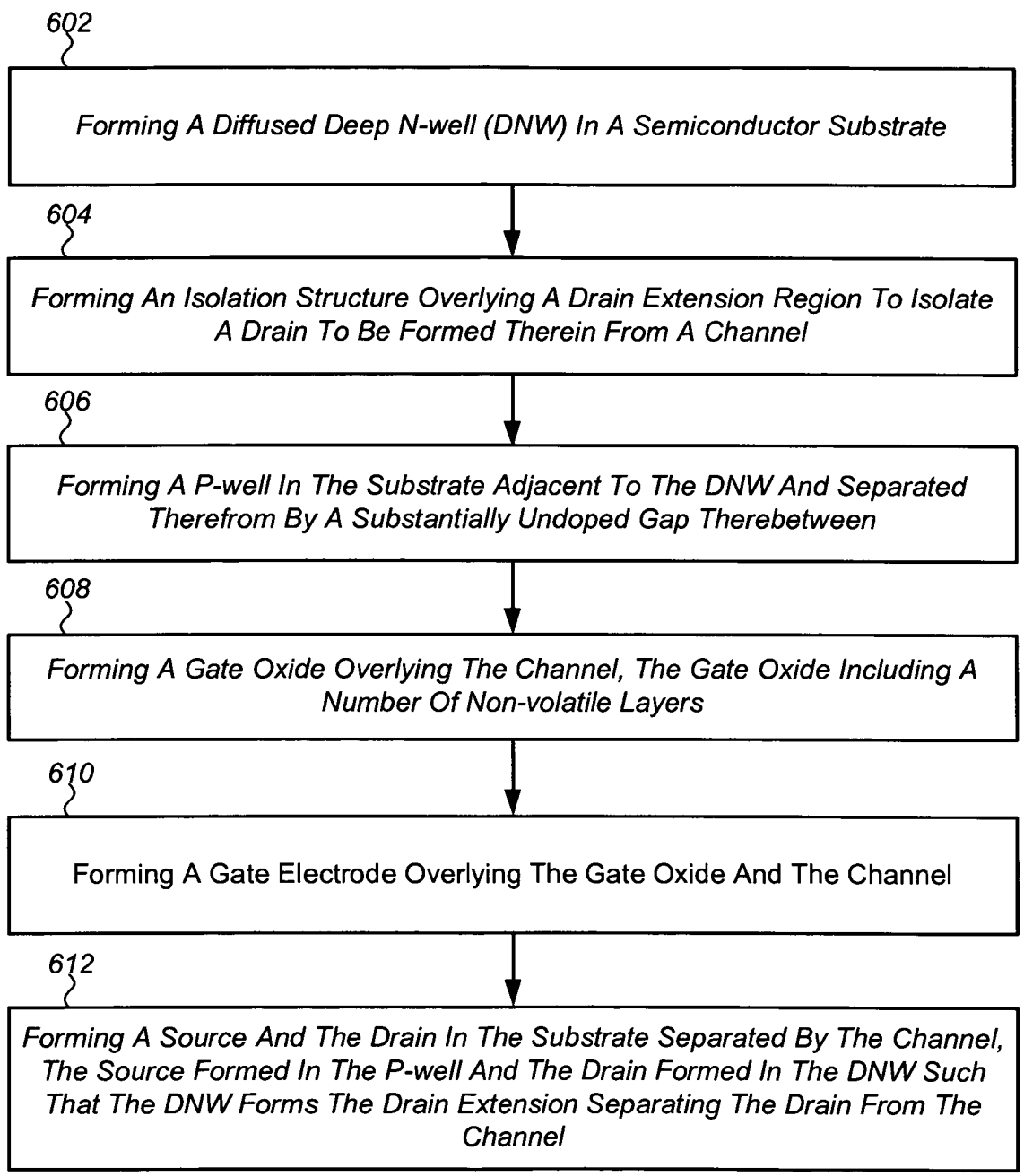
FIG. 6 is a flowchart of a method for forming a drain-extended high voltage NMOS transistor according to an embodiment of the present invention.
Figure 7:
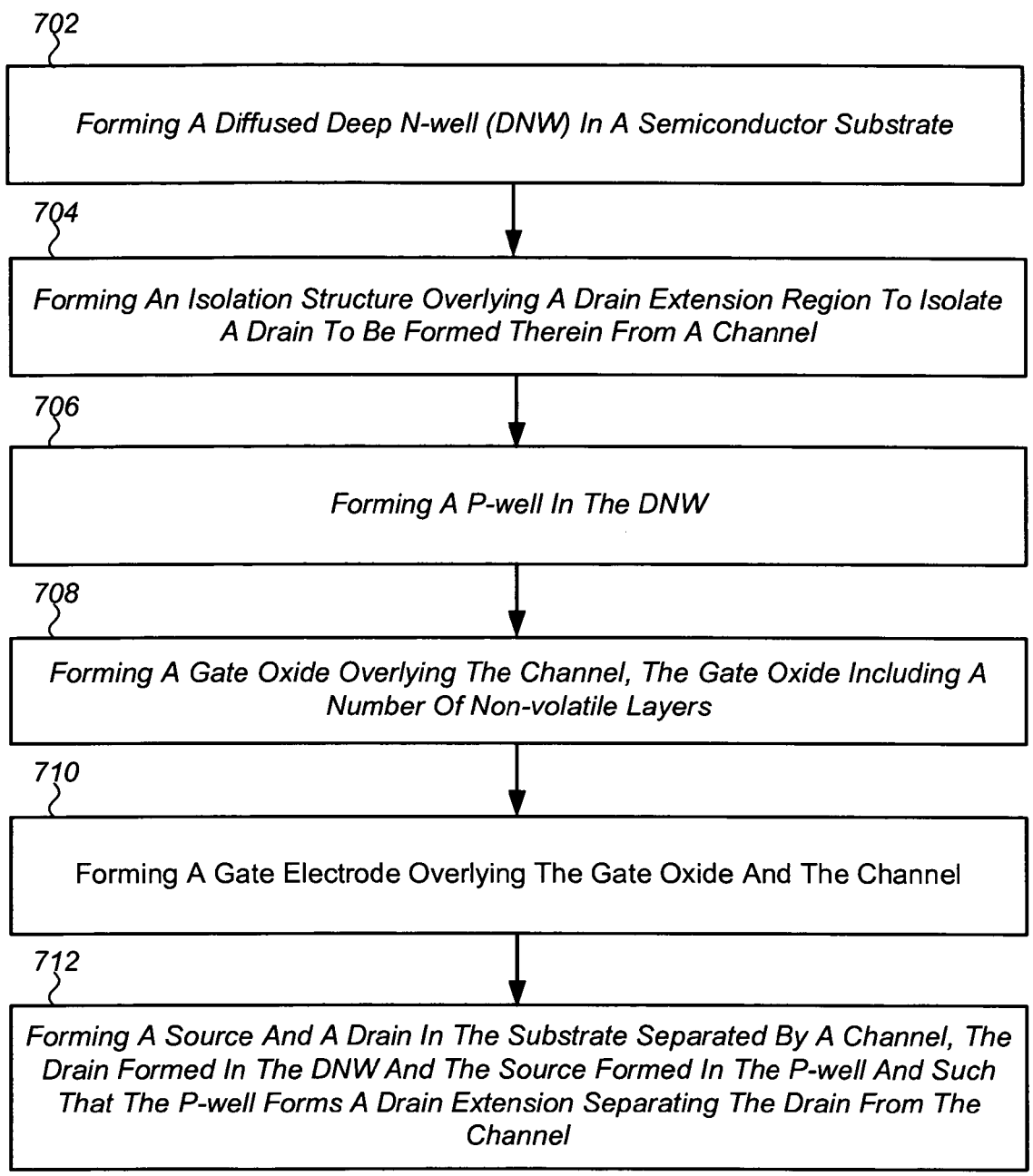
FIG. 7 is a flowchart of a method for forming a drain-extended high voltage PMOS transistor according to an embodiment of the present invention.

Methods for fabricating drain-extended high voltage transistors according to various embodiments of the present invention will now be described in greater detail with reference to FIGS. 6 and 7. FIGS. 6 and 7 are flowcharts of methods for forming or fabricating high voltage, drain-extended NMOS and PMOS transistors, respectively.

Referring to FIG. 6, one method of fabricating a DE NMOS begins with the forming of a diffused deep n-well (DNW) in a semiconductor substrate (Step 602). The DNW is used for the drain extension in a DE NMOS transistor and as a well tub in a DE PMOS transistor. The method of forming the DNW may include, for example, an ion implant of the appropriate ion species, i.e., $As^+$ or $P^+$, followed by a long or sustained, high temperature drive-in step to diffuse the implanted ions throughout the DNW. By a long or sustained, high temperature drive-in step it is meant heating the implanted substrate to a temperature of from about 1000° C. to about 1150° C., and more preferably at least about 1100° C., for a period from about 120 minutes (min) to about 1500 min, and more preferably at least about 300 min. A diffused DNW is preferred because it provides a more uniform or homogeneous doping gradient throughout the depth of the DNW.

An isolation structure is formed overlying a drain extension region to isolate a drain to be formed therein from the channel (Step 604). As noted above, the isolation structure may include a LOCOS or STI structure.

Next, a p-well is formed in the substrate adjacent to the DNW and separated therefrom by a substantially undoped gap or interface therebetween (Step 606). As noted above and in accordance with one aspect of the present invention, the standard CMOS p-well (PW) doping is split into three (3) separate levels of doping illustrated in FIGS. 4 and 5 as PW1, PW2 and PW3. Preferably, the P-well of the DE-PMOS transistor is simultaneously implanted or formed at the same time. More preferably, the first p-well doping (PW1) is a blanket implant implanted without a mask layer covering a surface of the substrate. The second p-well doping implant (PW2) is targeted to create the drain extension region of the DE PMOS transistor as well as protecting the source of the DE NMOS transistor against punch through. The third and highest level of doping (PW3) is selected such that the sum of all (PW1+PW2+PW3) used to form the p-well in which the source of the DE NMOS is fabricated. Generally, the p-well of the DE NMOS is doped with Boron impurities or dopant ions with a peak concentration of from about $1e17$ cm$^{-3}$ to about $3e17$ cm$^{-3}$.

A gate oxide is formed overlying the channel region (Step 608), and a gate electrode formed overlying the gate oxide and the channel (Step 610). Generally, the gate oxide and gate electrode are formed by the sequential deposition or growth of a dielectric material, such as a silicon-oxide, and a conducting material, such as a polycrystalline silicon, followed by etching or patterning to form the gate oxide and gate electrode. Preferably, the gate oxide includes a number of non-volatile layers to further raise the breakdown voltage of the transistor.

Finally, the source and drain are formed in the substrate separated by a channel region (Step 612). Preferably, the source is formed in the p-well and the drain formed in the DNW such that the DNW forms a drain extension separating the drain from the channel.

A method for fabricating DE PMOS will now be described in greater detail with reference to FIG. 7.

Referring to FIG. 7, one method of fabricating a DE NMOS begins with the forming of a diffused deep n-well (DNW) in a semiconductor substrate (Step 702). The DNW is used as a well tub in a DE PMOS transistor. As noted above, the method of forming the DNW may include, for example, an ion implant of the appropriate ion species, i.e., $As^+$ or $P^+$, followed by a long or sustained, high temperature drive-in step to diffuse the implanted ions throughout the DNW.

An isolation structure is formed overlying the drain extension region to isolate a drain to be formed therein from the channel (Step 704). As noted above, the isolation structure may include a, LOCOS or STI structure.

Next, a p-well is formed in the DNW (Step 706). As noted above, the standard CMOS p-well (PW) doping is split into three separate levels of doping—PW1, PW2 and PW3. Preferably, the P-well of the DE-PMOS transistor is simultaneously implanted or formed at the same time as that in the DE-NMOS. More preferably, as illustrated in FIG. 5, the first p-well doping (PW1) and the second p-well implant (PW2) are implanted into the p-well of the DE-PMOS to create the drain extension region of the DE PMOS transistor. Generally, the drain extended region of the DE PMOS is doped with Boron impurities or dopant ions with a concentration of from about $2e16$ cm$^{-3}$ to about $1e17$ cm$^{-3}$.

Next, a gate oxide is formed overlying the channel region (Step 708), and a gate electrode formed overlying the gate oxide and the channel (Step 710). Generally, the gate oxide and gate electrode are formed by the sequential deposition or growth of a dielectric material (silicon-oxide) and a conducting material (poly), followed by patterning to form the gate oxide and gate electrode. Preferably, the gate oxide includes a number of non-volatile layers to further raise the breakdown voltage of the transistor.

The source and drain are formed in the substrate separated by a channel region (Step 712). Preferably, the source is formed in the DNW and the drain formed in the p-well such that the p-well forms a drain extension separating the drain from the channel region. Both source and drain extended region are separated from p-type substrate by n-type DNW.

The advantages of the architecture and method of the present invention over previous or conventional approaches include: (i) a DE transistor having a high breakdown voltage (DE NMOS BV$\geq$80V and DE PMOS BV$\geq$60V); (ii) fabrication of the DE, high voltage transistor is fully compatible with and capable of being embedded into an existing CMOS flow; (iii) it can be embedded into the existing CMOS flow with only minimal additional masking and process steps, i.e., with only 2 additional masking layers and 2 additional implants to split the standard CMOS p-well implant into three separate implants (PW1, PW2, PW3); and (iv) adding a very lightly doped region between the drain extension (DE) and channel region to form a P-I-N region, thereby further increasing the DE junction breakdown voltage. Because the very lightly doped region in the substrate between the drain extension and the source of the DE NMOS device is created by blanket PW1 implant, only one additional implant is needed as compared to the standard low voltage CMOS process flow.

The foregoing description of specific embodiments and example have been presented for the purpose of illustration and description, and although the invention has been described and illustrated by the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A circuit formed in a semiconductor substrate, the circuit including at least one high voltage, drain-extended (DE) n-channel metal-oxide-semiconductor (NMOS) transistor, the DE NMOS transistor comprising:

a source and a drain formed in the semiconductor substrate, the source separated from the drain by a channel region;

a number of diffused deep n-wells (DNWs), at least one of the number of DNWs forming the drain-extension region for the DE NMOS transistor, the drain extension region surrounding the drain and extending a predetermined distance into the channel region, the drain extension region having a doping concentration lower than the source and the drain to achieve depletion during reverse biasing of the transistor, thereby raising a breakdown voltage thereof;

a p-well region substantially surrounding the source and extending in to the channel region, the p-well region including a first p-well section (PW1) with doping concentration lighter than the doping of the source and a second p-well section (Pw2) in between the PW1 and the source, the PW2 having doping concentration heavier than the PW1 doping concentration and having doping concentration lighter than the doping concentration of the source an isolation structure to isolate the drain from the channel region, and wherein the drain extension regions of the DE NMOS transistor extend underneath the isolation structure; and wherein the channel region of the DE-NMOS further comprises a substantially undoped gap between the DNW and a p-well surrounding the source, the gap substantially undoped by doping of the DNW and the p-well.

2. A circuit according to claim 1, wherein the circuit further includes a DE p-channel MOS (PMOS) transistor, and wherein another of the number of DNWs forms a well tub for the DE PMOS transistor.

3. A circuit according to claim 2, wherein DE PMOS further includes a second p-well formed in the DNW surrounding a drain thereof and extending a predetermined distance into a channel region of the DE PMOS transistor to form a drain-extension region therefore, and wherein the drain-extension region of the DE-PMOS transistor is implanted and diffused to achieve depletion during reverse biasing of the DE-PMOS transistor and achieve high breakdown voltage.

4. A circuit according to claim 2, wherein a full p-well doping is utilized to form the p-well surrounding a source of the DE NMOS transistor, while a lowered doping level is utilized to form the p-well of the DE PMOS transistor including the drain extension region thereof.

5. A circuit according to claim 2, wherein the DE PMOS transistor further comprises an isolation structure to isolate the drain thereof from the channel region thereof, and wherein the drain extension regions of the DE NMOS transistor and the DE PMOS transistor extend underneath the respective isolation structures.

6. A circuit according to claim 5, wherein the isolation structures comprise a shallow trench isolation (STI) structure or a local oxidation of silicon (LOCOS) structure.

7. A circuit according to claim 2, wherein the DE NMOS transistor and the DE PMOS transistor comprise a lateral power CMOS transistor architecture.

8. A high-voltage n-channel metal-oxide-semiconductor (NMOS) transistor comprising:

a source and a drain formed in a semiconductor substrate, the source separated from the drain by a channel region;

a diffused deep n-well (DNW) formed by ion implantation to form a drain-extension region for the transistor, the drain extension region surrounding the drain and extending a predetermined distance into the channel region, the drain extension region having a doping concentration lower than the source and the drain to achieve depletion during reverse biasing of the transistor, thereby raising a breakdown voltage thereof;

a p-well region substantially surrounding the source and extending in to the channel region, the p-well region including a first p-well section (PW1) with doping concentration lighter than the doping of the source and a second p-well section (Pw2) in between the PW1 and the source, the PW2 having doping concentration heavier than the PW1 doping concentration and having doping concentration lighter than the doping concentration of the source an isolation structure to isolate the drain from the channel region, and wherein the drain extension regions of the DE NMOS transistor extend underneath the isolation structure; and wherein the source is formed in a p-well surrounding the source and extending into the channel region, and the channel region further comprises a substantially undoped gap between the DNW and a p-well surrounding the source, the gap substantially undoped by doping of the DNW and the p-well.

9. A transistor according to claim 8, wherein the p-well is formed by a plurality of discreet ion implant steps into the substrate, and wherein the p-well surrounding the source receives implanted ions from each of the plurality of discreet ion implant steps.

10. A transistor according to claim 8, further comprising a gate oxide overlying the channel region, the gate oxide including a number of non-volatile layers to raise the breakdown voltage of the transistor.

11. A transistor according to claim 8, wherein the isolation structure comprises a shallow trench isolation (STI) structure or a local oxidation of silicon (LOCOS) structure.

12. A transistor according to claim 8, wherein the NMOS transistor comprises a lateral power CMOS transistor architecture.

13. A high voltage, p-channel metal-oxide-semiconductor (PMOS) transistor comprising:
   a diffused deep n-well (DNW) formed in a semiconductor substrate to form a well tub for the PMOS transistor;
   a source and a drain formed in the DNW, the drain formed in a p-well and separated from the source by a channel region;
   a p-well region substantially surrounding the souce and extending into the channel region, the p-well region including a first p-well section (PW1) with doping concentration lighter than the doping of the source and a second p-well section (PW2) in between the PW1 and the source, the PW2 having doping concentration heavier than the PW1 doping concentration and having doping concentration lighter than the doping concentration of the source; and
   a drain extension region formed in the p-well and surrounding the drain and extending a predetermined distance into the channel region, the drain extension region having a doping concentration lower than the drain to achieve depletion during reverse biasing of the transistor, thereby raising a breakdown voltage thereof.

14. A transistor according to claim 13, further comprising a gate oxide overlying the channel region, the gate oxide including a number of non-volatile layers to raise the breakdown voltage of the transistor.

15. A transistor according to claim 13, further comprising an isolation structure to isolate the drain from the channel region, and wherein the drain extension region extends underneath the isolation structure.

16. A transistor according to claim 13, wherein the PMOS transistor comprises a lateral power CMOS transistor architecture.

17. A circuit according to claim 1, wherein the drain extension region is formed from the same material that formed the PW2.

18. A circuit according to claim 1, further comprising:
   the at least one of the number of DNWs forming the drain-extension region surrounding the drain and extending a predetermined distance into the channel region including a first p-well section (PW1) with doping lighter than the doping of the drain and a second p-well section (PW2) in between the PW1 and the drain, the PW2 having doping heavier than the PW1 doping and having doping lighter than the doping of the drain.

* * * * *

UNITED STATES PATENT AND TRADEMARK OFFICE
CERTIFICATE OF CORRECTION

PATENT NO. : 7,592,661 B1  
APPLICATION NO. : 11/489047  
DATED : September 22, 2009  
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 28 days.

Signed and Sealed this

Twenty-first Day of September, 2010

David J. Kappos  
*Director of the United States Patent and Trademark Office*